(12) United States Patent
Wu et al.

(10) Patent No.: US 6,753,607 B1
(45) Date of Patent: Jun. 22, 2004

(54) STRUCTURE FOR IMPROVING INTERLEVEL CONDUCTOR CONNECTIONS

(75) Inventors: Zhen-Cheng Wu, Hsinchu (TW);
Yung-Cheng Lu, Taipei (TW);
Syun-Ming Jang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/441,511

(22) Filed: May 19, 2003

(51) Int. Cl.[7] .............................................. H01L 23/48
(52) U.S. Cl. .................... 257/750; 257/758; 257/774
(58) Field of Search ................................ 257/750, 758, 257/774

(56) References Cited

U.S. PATENT DOCUMENTS

| | | | | |
|---|---|---|---|---|
| 6,287,990 B1 | * | 9/2001 | Cheung et al. | 438/780 |
| 6,316,351 B1 | * | 11/2001 | Chen et al. | 438/638 |
| 6,465,341 B1 | * | 10/2002 | Pramanick | 438/622 |
| 6,465,345 B1 | * | 10/2002 | Nogami et al. | 438/631 |
| 6,498,112 B1 | * | 12/2002 | Martin et al. | 438/763 |

\* cited by examiner

*Primary Examiner*—Jasmine Clark
(74) *Attorney, Agent, or Firm*—Duane Morris LLP

(57) ABSTRACT

The present invention relates to an improved integrated circuit structure including adjacent conductive and dielectric layers having a continuous, planar top surface, produced by a process which includes treating the surface with a silane compound, followed by depositing an etch stop layer over the surface, wherein a glue layer is not applied to the surface.

8 Claims, 1 Drawing Sheet

STRUCTURE FOR IMPROVING INTERLEVEL CONDUCTOR CONNECTIONS

BACKGROUND OF THE INVENTION

1. Field of the Invention

The present invention relates to an interconnection structure and process used in semiconductor manufacturing and, more particularly, to a structure and method for improving the reliability of connections between different layers of metal or conducting material in the fabrication of integrated circuits.

2. Description of Prior Art

In order to improve the device speed of logic on sub-quarter micron semiconductor circuits, copper has gained popularity as an interconnect material. This takes advantage of copper's low electrical resistivity and superior resistance to electromigration. As the device dimensions shrink, the resistance-capacitance (RC) time delay of the interconnect system becomes one of the most important limitation factors to the performance of the integrated circuit. In order to minimize the signal propagation delay, it is inevitable to use low dielectric constant materials, such as inter-layer and intra-layer dielectrics (ILDs). While many low-k materials have been used as ILDs, silicon nitride with a high dielectric constant is a likely candidate for the etch-stop layer required in copper damascene structures. Therefore, it would be desirable to replace silicon nitride by new materials with lower dielectric constants, in order to further reduce the effective dielectric constants to further reduce the effective dielectric constant of the Cu interconnect system. A continuing interest relates to low stress and thermally stable low-k amorphous silicon carbide-based films deposited by plasma-enhanced chemical vapor deposition using organo-silicon gases.

At present, a glue layer is used to prevent Cu from oxidation during deposition of the etch stop layer. A prototypical structure, in ascending order, includes: Cu/glue layer/etch stop layer. In certain instances, the glue layer may hinder throughput, as well as result in process instability due to thickness variations. In accordance with the present invention, a structure and method for improving the reliability of connections between different layers of metal or conducting material in the fabrication of integrated circuits is disclosed.

SUMMARY OF THE INVENTION

The present invention relates to an improved integrated circuit structure including adjacent conductive and dielectric layers having a continuous, planar top surface, produced by a process which comprises treating the surface with a silane compound, followed by depositing an etch stop layer over the surface, wherein a glue layer is not applied to the surface.

BRIEF DESCRIPTION OF THE DRAWINGS

In the accompanying drawings forming a material part of this description, there is shown.

DESCRIPTION OF THE PREFERRED EMBODIMENTS

In accordance with the present invention, SiC is not used as a glue layer. Instead, before the deposition (main deposition process) of SiOC, the Cu and low-k surface is subjected to a particular treatment, e.g., 4MS(tetramethylsilane) at a temperature of e.g., 400° C. Then, a SiOC layer is deposited thereon. The 4MS used in the treatment of the present invention can be replaced by e.g., trimethylsilane, dimethylsilane or methylsilane. The temperature of treatment may be in the range of from about 350–450° C., while the duration of treatment may be from about 5–30 seconds.

Figure 1:
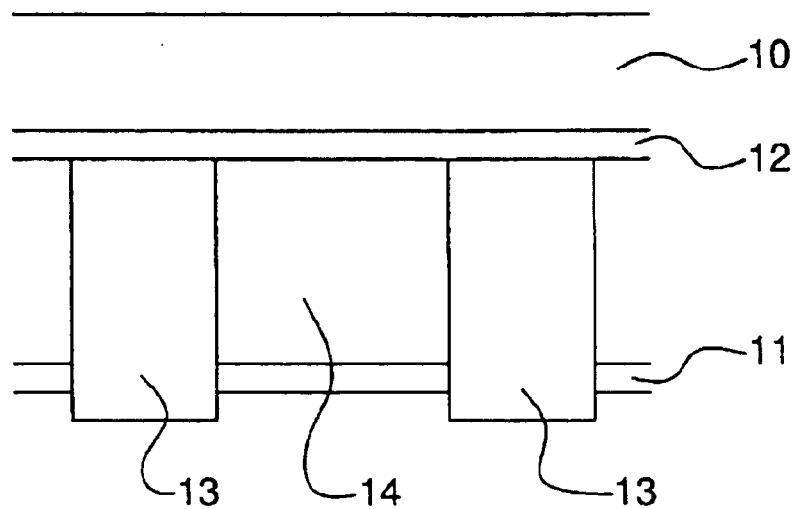
FIG. 1 schematically illustrating in cross-sectional representation the prior art and FIG. 2 an embodiment of the present invention.

Referring now to FIG. 1, present in the prior art are SiOC etch stop layers 10 and 11, SiC glue layer 12, Cu or e.g., Al metal electrodes 13 and intermetal dielectric layer 14. Thicknesses of layers may be about 550 Angstroms for etch stop layer 10 and 20–50 Angstroms for glue layer 12. Further details relative to the state of the art maybe found in U.S. Pat. No. 6,383,947, herein incorporated by reference.

Figure 2:
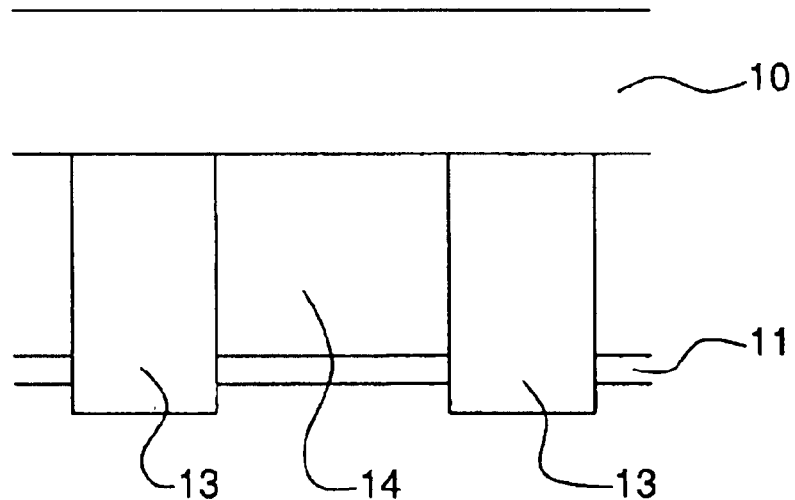

Referring now to FIG. 2, note the absence of glue layer 12 in the present invention. The following criteria are present for implementation: Prior to etch stop deposition, tetramethylsilane or other suitable material is applied by e.g., in-situ annealing, to form an etch stop without a glue layer. The following deposition conditions are present: A flow rate of 1000–1500 sccm, a pressure of 1.7 mTorr, elapsed time of 5–100 sec., and a temperature of 350–450° C.

The present invention provides a structure and process that results in enhanced throughput and reliability performance as compared to prior structures. In the testing of representative structures, as depicted in FIGS. 1 and 2 and described above, by removing the glue layer in accordance with the present invention, enhanced throughput was achieved, e.g., from 22–23 to 25–26 wafers per hour in 8 inch diameter, and Jmax (A/cm$^2$) values related to electromigration performance were improved from 4.74E+05 (with glue layer) to 1.30E+06 (without glue layer) and from 1.05E+05 (with glue layer) to 1.21E+06 (without glue layer) in standard, comparison electromigration runs.

While the invention has been particularly shown and described with reference to the preferred embodiments thereof, it will be understood by those skilled in the art that various changes in form and details may be made without departing from the spirit and scope of the invention.

What is claimed is:

1. An improved integrated circuit structure including adjacent conductive and dielectric layers having a continuous, planar top surface, produced by a process which comprises:

treating the surface with a silane compound, followed by;

depositing an etch stop layer over the surface;

wherein a glue layer is not applied to the surface, wherein the silane compound is selected from the group consisting of tetramethylsilane, trimethylsilane, dimethylsilane and methylsilane.

2. The structure as recited in claim 1, wherein the temperature of treatment is from about 350–450° C.

3. The structure as recited in claim 2, wherein the temperature of treatment is about 400° C.

4. The structure as recited in claim 1, wherein the duration of treatment is from about 5–100 seconds.

5. The structure as recited in claim 1 wherein the duration of treatment is from about 5–100 seconds.

6. A method of fabricating an integrated circuit including adjacent conductive and dielectric layers having a continuous, planar top surface, produced by a process which comprises:

treating the surface with a silane compound, followed by;

depositing an etch stop layer over the surface;

wherein a glue layer is not applied to the surface, wherein the silane compound is selected from the group consisting of tetramethylsilane, trimethylsilane, dimethylsilane and methylsilane.

7. The structure as recited in claim 6, wherein the temperature of treatment is from about 350–450° C.

8. The structure as recited in claim 7, wherein the temperature of treatment is about 400° C.

* * * * *

UNITED STATES PATENT AND TRADEMARK OFFICE
CERTIFICATE OF CORRECTION

PATENT NO. : 6,753,607 B1
DATED : June 22, 2004
INVENTOR(S) : Wu et al.

It is certified that error appears in the above-identified patent and that said Letters Patent is hereby corrected as shown below:

Column 2,
Line 14, delete "Pat. No.:6,383,947" and insert -- Pat. No. 6,383,943 --;
Lines 58-59, delete claim No. 5.

Signed and Sealed this

Sixteenth Day of August, 2005

JON W. DUDAS
*Director of the United States Patent and Trademark Office*